United States Patent
Takada et al.

(10) Patent No.: US 6,281,429 B1
(45) Date of Patent: Aug. 28, 2001

(54) PHOTOELECTRIC CONVERSION ELEMENT

(75) Inventors: Hokuto Takada; Yoshiyuki Ono, both of Minamiashigara (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 09/625,279

(22) Filed: Jul. 25, 2000

(30) Foreign Application Priority Data

Nov. 19, 1999 (JP) .................................... 11-330079

(51) Int. Cl.$^7$ ............................ H01L 31/04; H01M 6/36
(52) U.S. Cl. ......................... 136/256; 136/252; 257/431; 257/464; 257/43; 257/40; 429/111; 204/192.29; 438/98; 438/85; 438/82
(58) Field of Search .................... 136/256, 252; 257/431, 464, 43, 40; 429/111; 204/192.29; 438/98, 85, 82

(56) References Cited

U.S. PATENT DOCUMENTS

| | | | |
|---|---|---|---|
| 4,684,537 | 8/1987 | Graetzel et al. | 427/554 |
| 4,927,721 | 5/1990 | Gratzel et al. | 429/111 |
| 5,084,365 | 1/1992 | Gratzel et al. | 429/111 |
| 5,350,644 | * 9/1994 | Graetzel et al. | 429/111 |
| 5,420,043 | * 5/1995 | Niwa | 204/192.29 |
| 5,463,057 | 10/1995 | Graetzel et al. | 546/4 |
| 5,525,440 | 6/1996 | Kay et al. | 429/111 |
| 5,922,142 | * 7/1999 | Wu et al. | 136/260 |

FOREIGN PATENT DOCUMENTS

| | | |
|---|---|---|
| 53-131782 | 11/1978 | (JP) . |
| 54-27387 | 3/1979 | (JP) . |
| 56-35477 | 4/1981 | (JP) . |
| 1-215070 | 8/1989 | (JP) . |
| 1-220380 | 9/1989 | (JP) . |
| 4-10576 | 1/1992 | (JP) . |
| 5-67797 | 3/1993 | (JP) . |
| 6-85294 | 3/1994 | (JP) . |
| 6-275130 | 9/1994 | (JP) . |
| 8-15097 B2 | 2/1996 | (JP) . |

OTHER PUBLICATIONS

O'Regan et al., "A low-cost, high-efficiency solar cell based on dye-sensitized colloidal TiO2 films", Nature, vol. 353, 1991, pp. 737-740.

* cited by examiner

*Primary Examiner*—Alan Diamond
(74) *Attorney, Agent, or Firm*—Oliff & Berridge, PLC

(57) ABSTRACT

A photoelectric conversion element responsive to a desired conversion efficiency is provided. A photoelectric conversion element including a transparent electrode including a light-receiving face, a photoelectric conversion layer, and a counter electrode is provided, in which a thickness L (m) of the transparent electrode satisfies an equation (1)

$$1.2 \times 10^{-2} \times \rho \leq L \leq 4.6/f \quad (1)$$

where $\rho$ represents a resistivity ($\Omega$m), and f represents an effective photon flux density loss coefficient (1/m).

2 Claims, 7 Drawing Sheets

PHOTOELECTRIC CONVERSION ELEMENT

BACKGROUND OF THE INVENTION

1. Field of the Invention

The present invention relates to a photoelectric conversion element (which may be referred to as a "element" hereinafter), and in particular relates to an inexpensive photoelectric conversion element.

2. Discussion of the Related Art

Global warming due to combustion of fossil fuel and the growing energy needs associated with the population growth have become problems associated with extinction of the human race. It is needless to say that sunlight has developed the environment of the Earth and has been an energy source for all the lives including the human race from the earliest times until today. In recent years, sunlight is contemplated to be utilized as a clean energy source that is unlimited and produces no hazardous substances.

Among others, solar batteries which convert the light energy into the electrical energy, receive attention as a promising technology. Single crystal, polycrystal, or amorphous silicon, or compound semiconductors, such as CuInSe, GaAs, or CdS, are used as photovoltaic materials for the solar batteries. Since the solar batteries using these inorganic semiconductors exhibit relatively high energy conversion efficiency between 10% and 20%, they are widely used as power supplies for remote sites, or auxiliary power supplies for portable small electronic equipment.

From the viewpoint of the purpose of cutting back the fossil fuel consumption to prevent the environment of the Earth from becoming worse as described above, however, at the present time, it cannot be said that the solar batteries using the inorganic semiconductors are sufficiently effective. That's because these solar batteries using the inorganic semiconductor are produced in a plasma CVD or high temperature crystal growth process, so that much energy is required to produce their elements. In addition, they contain components, such as Cd, As, or Se, which may have a deleterious effect on the environment, so that there is a possibility that the discarded photoelectric conversion elements may result in an environmental destruction.

In addition, many solar batteries using organic materials which are intended to provide larger areas and lower prices have been proposed (for example, see Japanese Patent Laid-OpenNo. 53-131782 (1978), Japanese Patent Laid-Open No. 54-27387 (1979), Japanese Patent Laid-Open No. 56-35477 (1981), Japanese Patent Laid-Open No. 1-215070 (1989), Japanese Patent Laid-Open No. 4-10576 (1992), and Japanese Patent Laid-Open No. 6-85294 (1994) , those patents disclose organic solar cells having typically a first electrode having a light transparency, a second electrode and a single or a function-separated double layer organic photoelectric conversion element, but they are not yet in actual use because of their low conversion efficiency and low durability.

Under these circumstances, a photoelectric conversion element using semiconductor particulates sensitized by a coloring matter (hereinafter referred to as coloring matter sensitized photoelectric conversion element), a materials used for producing this element, and a method for producing this are disclosed in Nature (vol. 353, pp. 737–740, 1991), U.S. Pat. Nos. 4,927,721, 4,684,537, 5,350,644, 5,463,057, 5,525,440, 5,084,365, Japanese Patent Laid-Open No. 1-220380 (1989) that is Japanese equivalent of U.S. Pat. No. 4,927,721, and Japanese Patent Publication No. 8-15097 (1992) that is Japanese equivalent of U.S. Pat. No. 5,350,644. This coloring matter sensitized photoelectric conversion element is characterized in that a porous thin film of titanium dioxide spectrally sensitized with a ruthenium complex is used for a working electrode. Furthermore, since in this coloring matter sensitized photoelectric conversion element, inexpensive oxide semiconductors can be used without refining them to a high degree of purity, it is expected to provide a relatively inexpensive photoelectric conversion element. In addition, in this coloring matter sensitized photoelectric conversion element, the coloring matter used has a wide wavelength absorption range, and a high energy conversion efficiency of approximately 10% (AM 1.5) is attained.

On the other hand, it is desirable that a transparent electrode layer on the side of light-receiving face required in the structure of a common photoelectric conversion element has properties of low resistance and high transmissivity of visible rays, and a transparent electrode layer produced by forming a transparent conductive oxide film on a transparent insulating substrate, such as glass or plastic film, is presently used. However, the transparent conductive oxide film having such properties are produced in a sputtering or vacuum deposition process, so that its production requires a large-scale facility and much energy. Therefore, under the present circumstances, although the coloring matter sensitized photoelectric conversion element is relatively inexpensive, the cost for producing the transparent electrode layer in the photoelectric conversion element makes up the most part of its total production cost.

Also Japanese Patent Laid-Open No. 5-67797 (1993) discloses the same kind of coloring matter sensitized photoelectric conversion element having a light transparent electrode comprising an ITO film characterized in X-ray diffraction pattern. Japanese patent Laid-OpenNo. 6-275130 discloses an transparent conductive film formed on a substrate, the transparent conductive film having an oriented crystalline plane to the surface of the substrate and more than 80% transparency to visible light.

And, the conversion efficiency required for the photoelectric conversion element depends on the working conditions of the element, that is, load, power of radiated light, wavelength distribution, or size of the element. For example, the conversion efficiency required in the case where the element is installed outside of a house to convert sunlight into electric power available as an alternative to electric power obtained by thermal or atomic power generation is different from the conversion efficiency required in the case where it serves as a power supply for portable equipment to convert interior light into electric power.

SUMMARY OF THE INVENTION

The present invention resolves the problems of the related arts and achieves the purposes described below. That is, the present invention provides an inexpensive photoelectric conversion element responsive to the desired conversion efficiency.

The inventors have noted the fact that the transparent electrode on the side of the light-receiving face affects the conversion efficiency and production cost of the photoelectric conversion element, found that an inexpensive photoelectric conversion element responsive to the desired conversion efficiency may be provided by confining the thickness of the transparent electrode on the side of the light-receiving face within a particular range given by the relationship between its resistivity and its permeability, and then attained the present invention. In other words, the present invention provides; a photoelectric conversion element, provided with a transparent electrode having a light-receiving face, a photoelectric conversion layer, and a counter electrode, wherein a thickness L (m) of the transparent electrode satisfies an equation (1);

$$1.2 \times 10^{-2} \times \rho \leq L \leq 4.6/f \tag{1}$$

where ρ represents a resistivity (Ωm), and f represents an effective photon flux density loss coefficient (1/m). The photoelectric conversion layer may have a porous semiconductor layer carrying a coloring material thereon.

BRIEF DESCRIPTION OF THE DRAWINGS

Preferred embodiments of the present invention will be described in detail based on the following figures, wherein.

DETAILED DESCRIPTION OF THE PREFERRED EMBODIMENTS

Figure 1:
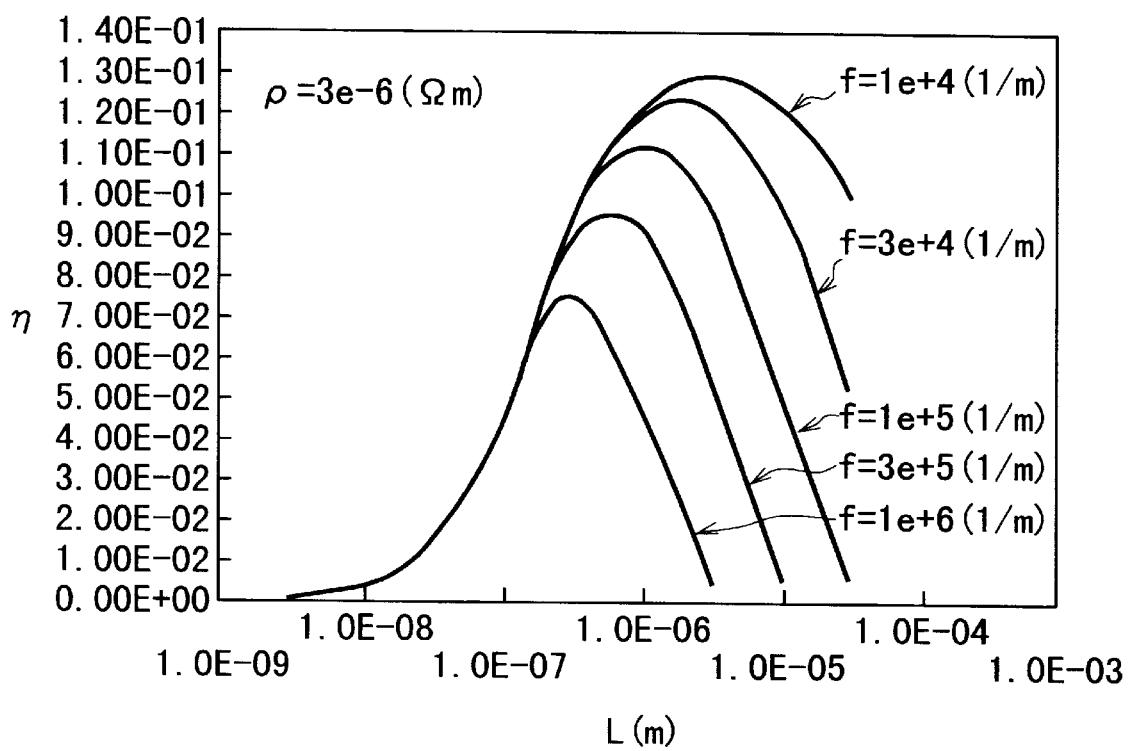
FIG. 1 shows the relationship between the conversion efficiency η and the layer thickness L in the case where the resistivity ρ has a constant value of $3 \times 10^{-6}$ (Ωm), and the effective photon flux density loss coefficient f varies in the range from $1 \times 10^4$ to $1 \times 10^6$ (1/m)

The photoelectric conversion element of the present invention is provided with at least a transparent electrode on the side of the light-receiving face, a photoelectric conversion layer, and a counter electrode. Here, it may have other layers as required. And the photoelectric conversion element of the present invention is the type of element to receive light on the side of the transparent electrode on the side of the light-receiving face. (Transparent electrode on the side of the light-receiving face)

The thickness L (m) of the transparent electrode on the side of the light-receiving face satisfies the equation (1);

$$1.2 \times 10^{-2} \times \rho \leq L \leq 4.6/f \tag{1}$$

more preferably satisfies the equation (2);

$$1.2 \times 10^{-2} \times \rho \leq L \leq 3.5/f, \tag{2}$$

or most preferably satisfies the equation (3);

$$1.2 \times 10^{-2} \times \rho \leq L \leq 2.8/f, \tag{3}$$

where ρ represents the resistivity (Ωm) , and f represents the effective photon flux density loss coefficient (1/m). The transparent electrode on the side of the light-receiving face includes a transparent conductive support and a transparent insulating support having a transparent conductive film formed on its surface. In the case where the electrode is the transparent conductive support, the thickness L (m) indicates the thickness of the transparent conductive support, and in the case where the electrode is the transparent insulating support having a transparent conductive film formed on its surface, it indicates the thickness of the transparent conductive film. And, in the case where the transparent conductive support or transparent conductive film consists of multiple layers, the thickness L (m) indicates the whole thickness of them.

In the transparent electrode on the side of the light-receiving face, the resistivity ρ (Ωm) is determined by the material used and conditions under which it is produced (crystal condition, for example, crystal or noncrystal) , and may, particularly, be measured with a resistivity measuring device based on a four probe method. Here, in the case where the electrode is the transparent conductive support, the resistivity ρ (Ωm) represents the resistivity of the transparent conductive support, and in the case where the electrode is the transparent insulating support having the transparent conductive film formed on its surface, it represents the resistivity of the transparent conductive film. And, in the case where the transparent conductive support or transparent conductive film consists of multiple layers, the resistivity $\rho$ ($\Omega$m) represents a value obtained by measuring the whole resistivity.

In the transparent electrode on the side of the light-receiving face, the effective photon flux density loss coefficient f (1/m) is a coefficient that indicates a rate of the effective incident photon flux density which is lost per unit thickness in the transparent electrode on the side of the light-receiving face, the effective incident photon flux density allowing for a wavelength dispersion of the light incident on the photoelectric conversion element and spectral sensitivity characteristics of the photoelectric conversion layer. It is defined by;

$$\exp(-fL) = \frac{\int_{\lambda_1}^{\lambda_2} \Phi_o(\lambda) \times t(\lambda, L) \times [1 - T(\lambda)] d\lambda}{\int_{\lambda_1}^{\lambda_2} \Phi_o(\lambda) \times [1 - T(\lambda)] d\lambda}, \quad (4)$$

where $\lambda$ represents the wavelength of the light, $\lambda_1$ and $\lambda_2$ represent upper and lower limits of the wavelength range in which the integrand may have a significant value, respectively, $\Phi_0$ ($\lambda$) represents the photon flux density of the incident light, t($\lambda$, L) represents the transmissivity of the transparent electrode on the side of the light-receiving face, T($\lambda$) represents the transmissivity of the photoelectric conversion layer, and L represents the thickness of the transparent electrode on the side of the light-receiving face.

In the transparent electrode on the light-receiving face, the effective photon flux density loss coefficient f (1/m) is determined by the spectral distribution of the incident light, and spectral characteristics of the photoelectric conversion layer and transparent electrode on the side of the light-receiving face. The spectral distribution of the incident light may be determined by comparing the radiation from the source of the incident light and the radiation from a standard light source whose spectral distribution is known, on a wavelength basis. And the spectral characteristics of the photoelectric conversion layer and transparent electrode on the side of the light-receiving face maybe measured using, for example, ultraviolet and visible rays absorption spectrum measuring device. Here, in the case where the electrode is the transparent conductive support, the effective photon flux density loss coefficient f (1/m) represents the effective photon flux density loss coefficient of the transparent conductive support, and in the case where the electrode is the transparent insulating support having the transparent conductive film formed on its surface, it represents the effective photon flux density loss coefficient of the transparent conductive film. And, in the case where the transparent conductive support or transparent conductive film consists of multiple layers, the effective photon flux density loss coefficient f (1/m) represents a value obtained by measuring the whole effective photon flux density loss coefficient.

By the thickness L (m) of the transparent electrode on the side of the light-receiving face satisfying the equation (1), an inexpensive photoelectric conversion element responsive to the desired conversion efficiency is provided. The reason may be supposed as follows.

Firstly, considering the case where the photoelectric conversion element is radiated with light, the photocurrent density in the photoelectric conversion element, $J_{in}$, is represented by an equation (5);

$$J_{in} = e \int \gamma \times [1-T(\lambda)] \times t(\lambda,L,k) \times \Phi_0(\lambda) d\lambda \quad (5)$$

where $\Phi_0$ ($\lambda$) represents the photon flux density of the incident light, $\nu$ represents the internal quantum efficiency, T($\lambda$) represents the transmissivity of the photoelectric conversion layer, t($\lambda$, L, f) depends on the effective photon flux density loss coefficient, and represents the rate of the radiated light which reaches the photoelectric conversion layer, e represents the quantity of the charge of the electron, $\lambda$ represents the wavelength of the light, L represents the thickness of the transparent electrode on the side of the light-receiving face, and f represents the effective photon flux density loss coefficient.

If the spectral line shape of the incident light is constant (for example, AM 1.5), the internal photocurrent density $J_{in}$ (A) is proportional to the power of the radiated light $P_0$ (J), so that it may be represented by the equation (6);

$$J_{in} = A \times e^{-fL} \times P_0 \quad (6)$$

where A represents a constant (A/W) depending on the photoelectric conversion element.

Furthermore, the relationship between the current density (J) and the voltage (V) in the photoelectric conversion element may be represented by the equation (7);

$$J = J_{in} - J_o \left[ \exp\left\{ \frac{e(V - V_o + R_s J)}{kT} \right\} - 1 \right], \quad (7)$$

where $J_{in}$ represents the photocurrent density (A), $J_0$ represents the saturation current density (A), $R_s$ represents the serial resistance value of the element ($\Omega$), k represents the Boltzmann's constant, T represents the absolute temperature (K), and $V_0$ represents the threshold voltage (V)

From the foregoing, the short-circuit current density $J_{sc}$ (A), the open-circuit voltage $V_{oc}$ (V), and the fill factor FF of the case where the photoelectric conversion element is radiated with the light having a power of radiation of $P_0$ (J) maybe determined. Using these values, the energy conversion efficiency $\eta$ of the photoelectric conversion element may be represented by the equation (8);

$$\eta = \frac{J_{sc} \cdot V_{oc} \cdot FF}{P_o}. \quad (8)$$

Figure 2:
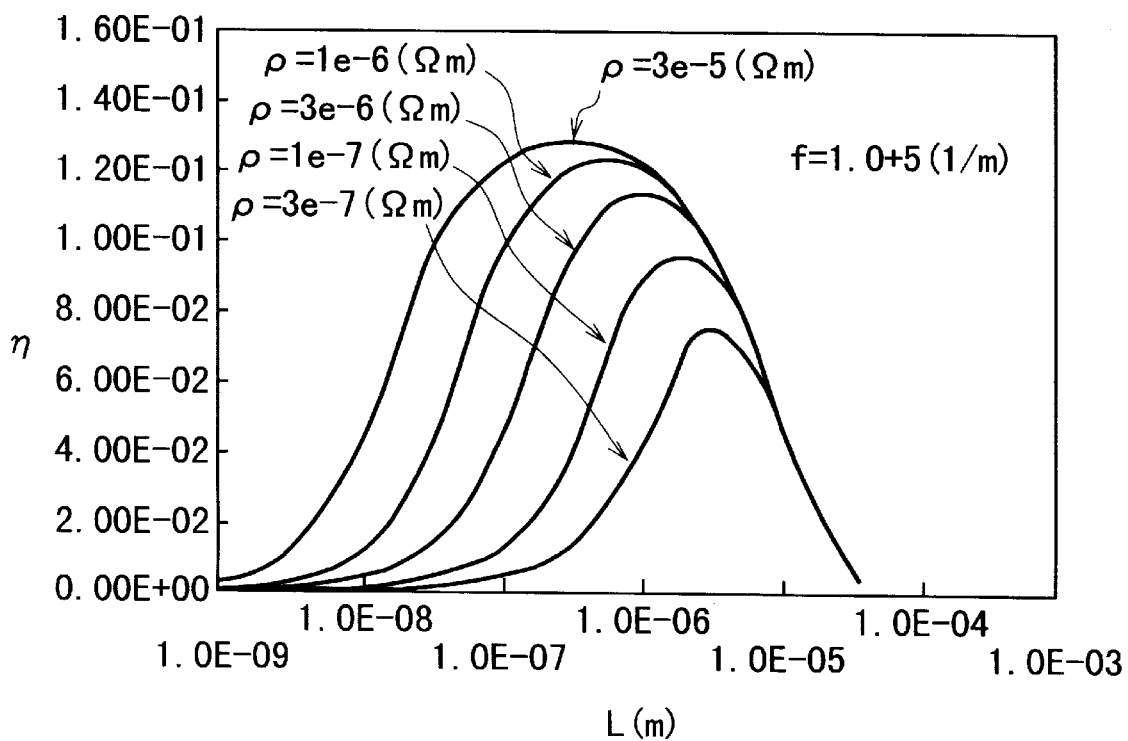
FIG. 2 shows the relationship between the conversion efficiency η and the layer thickness L in the case where the effective photon flux density loss coefficient f has a constant value of $1 \times 10^5$ (1/m) , and the resistivity ρ varies in the range from $3 \times 10^{-5}$ to $3 \times 10^{-7}$ (Ωm)
Figure 3:
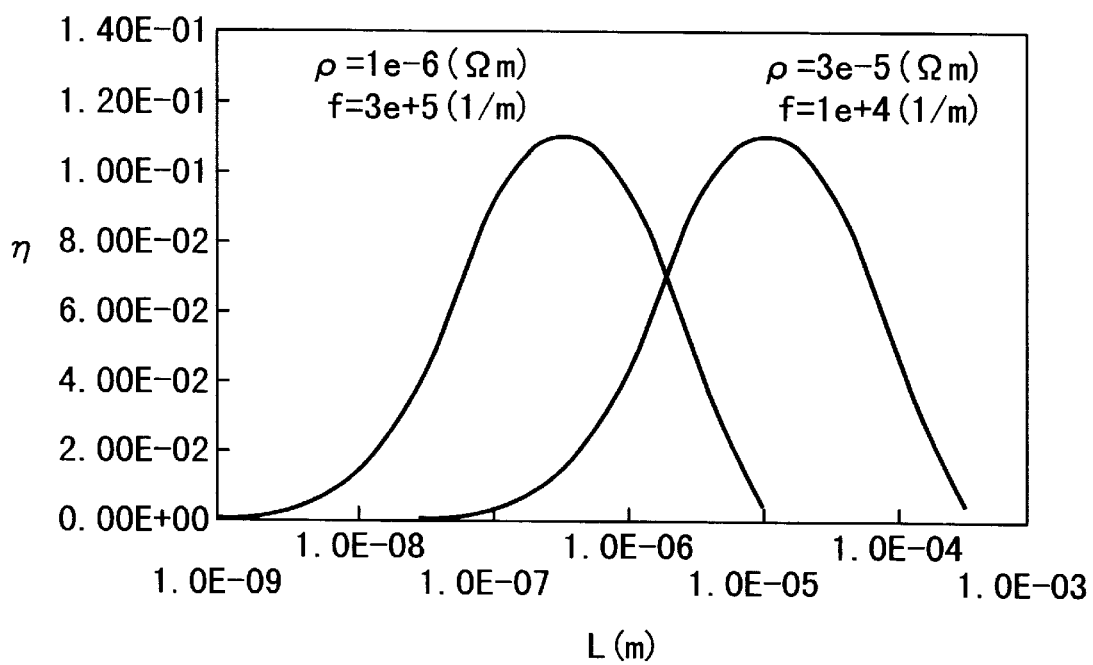
FIG. 3 shows the relationship between the conversion efficiency η and the layer thickness L in the cases where both the effective photon flux density loss coefficient f and the resistivity ρ are constant (that is, the case where ρ is $1 \times 10^{-6}$ (Ωm) , and f is $3 \times 10^5$ (1/m) and the case where ρ is $3 \times 10^{-5}$ (Ωm) and f is $1 \times 10^4$ (1/m))

Now, FIGS. 1 to 3 show a typical example that represents how the energy conversion efficiency $\eta$ of the photoelectric conversion element radiated with the light of AM 1.5 and 100 mW/cm$^2$ varies with the resistivity $\rho$ of the transparent electrode on the side of the light-receiving face, layer thickness L, and effective photon flux density loss coefficient f (here, for values on the light of AM 1.5 in a typical photoelectric conversion element, A =0.24 (A/W), $e^{-fL}$ =0.85, $J_0$=1×10$^{-9}$ (A), $V_0$=0.5 (V), $R_s$=5 ($\Omega$) , and T=300 (K) are used). FIG. 1 shows the relationship between the conversion efficiency $\eta$ and the layer thickness L in the case where the resistivity $\rho$ has a constant value of 3×10$^{-6}$ ($\Omega$m), and the effective photon flux density loss coefficient f varies in the range from 1×10$^4$ to 1×10$^6$ (1/m) . FIG. 2 shows the relationship between the conversion efficiency $\eta$ and the layer thickness L in the case where the effective photon flux density loss coefficient f has a constant value of 1×10$^5$ (1/m), and the resistivity $\rho$ varies in the range from 3×10$^{-5}$ to 3×10$^{-7}$ ($\Omega$m). FIG. 3 shows the relationship between the conversion efficiency η and the layer thickness L in the cases where both the effective photon flux density loss coefficient f and the resistivity ρ are constant (that is, the case where ρ is $1\times10^{-6}$ (Ωm), and f is $3\times10^5$, and the case where ρ is $3\times10^{-5}$ (Ωm) and f is $1\times10^4$ (1/m)).

As shown in FIGS. 1 and 2, the layer thickness L of the transparent electrode on the side of the light-receiving face has a layer thickness $L_p$ that provides the maximum value of the conversion efficiency η. In the range of $L<L_p$, the resistivity ρ predominantly controls the conversion efficiency η, and in the range of $L>L_p$, the effective photon flux density loss coefficient f predominantly controls the conversion efficiency η. And, as shown in FIG. 3, the layer thickness $L_p$, which provides the maximum value of the conversion efficiency η, varies with the resistivity ρ and the effective photon flux density loss coefficient f.

Thus, in order to provide a photoelectric conversion element having the required conversion efficiency for the resistivity ρ and effective photon flux density loss coefficient f both determined by the material used and its production conditions, the transparent electrode on the side of the light-receiving face of the photoelectric conversion element must have a thickness L that is not less than the minimum thickness predominantly determined by ρ, and is not more than the maximum thickness predominantly determined by f.

This implies that the transparent electrode on the side of the light-receiving face is required to have a low sheet resistance and high transmissivity of visible rays, which in tern both depend on the layer thickness, and are in a tradeoff relationship. In particular, the sheet resistance is a product of the inverse of the layer thickness and a volume resistivity, which is determined by the material in itself and its production conditions. The lower the sheet resistance or the greater the layer thickness, the better. However, due to the scattering by the local variation in the refraction factor caused by mainly defects in the film and the like, the transmissivity decreases as the layer thickness increases. In other words, in terms of the transmissivity, the smaller the layer thickness, the better.

Therefore, by the thickness L of the transparent electrode on the side of the light-receiving face being in the range between the minimum thickness and the maximum thickness, in other words, satisfying the equation (1), an inexpensive photoelectric conversion element responsive to the desired conversion efficiency is provided. If the thickness L of the transparent electrode on the side of the light-receiving face does not satisfy the equation (1), more particularly, if the thickness L is lower than $1.2\times10^{-2}\times\rho$, the desired conversion efficiency can riot he attained, and if L is higher than 4.6/f, the cost increases, and the desired conversion efficiency can not be attained.

Any transparent electrode on the side of the light-receiving face, which satisfies the equation (1), may be used. In particular, it may include a transparent conductive support, or transparent insulating support having a transparent conductive film formed on it surface (on the side of the photoelectric conversion layer), and preferably the transparent insulating support having the transparent conductive film formed on it surface is used. In addition, the transparent conductive support or transparent conductive film may consist of a single layer or multiple layers.

For the transparent conductive support, those that are conventionally known are used. In particular, they may include organic polymer film that contains conductive particles or the like.

For the transparent conductive film, those that are conventionally known are used. In particular, they may include metals (for example, platinum, gold, silver, copper, aluminum, rhodium, indium, etc.), carbon, conductive transparent metallic oxides, and the like. Among these materials, the conductive transparent metallic oxides are particularly preferable. Furthermore, in the conductive transparent metallic oxides, those containing at least one oxide selected from a tin oxide, indium oxide, and zinc oxide (for example, a fluorine-doped tin oxide, antimony-doped tin oxide, tin-doped indium oxide, aluminum-doped zinc oxide, gallium-doped zinc oxide, indium-doped zinc oxide, etc.) are particularly preferable in that they have both a high transmissivity and high electric conductivity.

For the transparent insulating support, those that are conventionally known are used. In particular, they may include a soft glass (for example, quartz glass, potash lime glass), transparent glass (for example, K7, lead glass), and transparent polymer film (for example, polyimide film, polyethylene terephthalate film).

(Photoelectric conversion layer)

For the photoelectric conversion layer, those that are conventionally known are used. In particular, they may include the photoelectric conversion layers comprised of single crystal, polycrystal, or amorphous silicon, or inorganic or organic semiconductor layer.

For the photoelectric conversion layer, since it makes up relatively large part of the production cost of the transparent electrode on the side of the light-receiving face in the photoelectric conversion element, a porous semiconductor layer carrying a coloring material on its surface is preferably used.

The porous semiconductor layer carrying a coloring material on its surface (hereinafter, it may be simply referred to as "porous semiconductor layer") will be described in detail below.

It is preferable that the coloring material is capable of absorbing the sunlight efficiently, and promptly transferring the charge between the coloring material and the semiconductor. Any coloring material which effects the sensitization may be used. In particular, it may include xanthene dyes (such as rhodamine B, Rose Bengal, eosin, or erythrosine), cyanine dyes (such as quinocyanine, or cryptocyanine), basic dyes (such as phencsafranine, thionine, ormethylene blue), porphyrin compounds (such as chlorophyll, zinc porphyrin, or magnesium porphyrin), complex compounds (such as azo dye, phthalocyanine compound, or Ru trisbipyridyl), anthraquinone dye, orpolycyclic quinone dye. A single coloring material may be used, or multiple coloring materials may be used together.

It is preferable that the materials of porous semiconductor layer are capable of promptly transferring the charge between the layer and the coloring material on its surface, and don't absorb the light having a wavelength absorbed by the coloring material. Further, it is more preferable that charged particles in a semiconductor have a higher mobility. Examples of such materials of the porous semiconductor layer include chalcogenides of metals (for example, oxide, sulfide, or selenide), and perovskites. Among the chalcogenides of metals, titanium oxide, tin oxide, zinc oxide, tungsten oxide, zirconium oxide, hafnium oxide, strontium oxide, indium oxide, cerium oxide, yttrium oxide, lanthanum oxide, vanadium oxide, niobium oxide, tantalum oxide, cadmium sulfide, and cadmium selenide, etc. are preferable. Among the perovskites, strontium titanate, and calcium titanate, etc. are preferable. Among these, the titanium oxide, zinc oxide, tin oxide, arid tungsten oxide are particularly preferable.

It is preferable that the porous semiconductor layer has a structure that has a large specific surface area so that a sufficient amount of the coloring materials can be held in the porous semiconductor layer, and allows the generated charged particles to be easily transferred. Examples of such a structure may include a structure comprised of aggregated particulates, a treelike structure, a blood vessel like structure, and a fractal structure. In the case of the structure comprised of the aggregated particulates, the diameters of the particulates preferably fall within the range between 5 and 200 nm, and more preferably fall within the range between 8 and 100 nm, with the assumption that the particulates are regarded as primary particles each having a diameter obtained by converting projected areas of the particulates into areas of circles and averaging the diameters of the circles.

Generally, as the layer thickness of the porous semiconductor layer is increased, the amount of the coloring materials carried per unit projected area is also increased so that the capture probability of the photon is increased, while the diffusion length of the generated chargedparticles is increased so that the probability of the recombination of the charges is increased. Therefore, the porous semiconductor layer has a preferable layer thickness. The layer thickness preferably falls within the range between 0.1 and 100 $\mu$m, andmore preferably falls within the range between 0.1 and 20 $\mu$m.

It is preferable that the photoelectric conversion layer has a charge transport layer, as well as the porous semiconductor layer carrying the coloring materials on it surface.

It is preferable that the charge transport layer is formed from liquid, gel, or solid materials that allow the process for restoring the coloring materials to their ground states via an exchange of the charges between the layer and the photosensitized coloring materials to be promptly carried out, and the charges to be promptly transported through the charge transport layer. For example, such materials may include an electrolyte solution containing at least materials that reversibly undergo oxidation and reduction, polymer gel electrolyte, solid electrolyte, and semiconductor. The oxidation-reduction system used for the electrolyte solution may include an iodide ion/iodine, bromide ion/bromine, quinone/hydroquinone, ferrous ion/ferric ion, cuprous ion/cupric ion. The solvents used for the electrolyte solution may include water, polar solvent (for example, acetonitrile, pyridine, dimethyl acetelmide, propylene carbonate, or ethylene carbonate), or mixture of these solvents. In addition, for the purpose of increasing the electric conductivity of the electrolyte solution, a supporting electrolyte may be added to the electrolyte solution. The supporting electrolyte may include a calcium chloride, sodium sulfate, ammonium chloride.

(Counter electrode)

Although any counter electrode which is good conductor may be used, platinum, palladium, rhodium, ruthenium, etc. are preferably used because of their low overvoltage for the oxidation-reduction reaction. Each of these materials may constitute a counter electrode by itself, or may be provided on a conductive or insulating support to constitute a counter electrode.

The counter electrode preferably has a sufficiently low resistance. For example, in the case of a plate-like counter electrode, its surface resistance is preferably not more than 100 $\Omega$/, more preferably not more than 10 $\Omega$/, and most preferably not more than 1 $\Omega$/.

It is preferable that the counter electrode has a property of reflecting the light incident on the side of the transparent electrode on the side of the light-receiving face.

In the photoelectric conversion element according to the present invention, it is preferable that the materials used for each of the layers and electrodes can be obtained relatively easily, have low levels of deleteriousness and toxicity, and are fast.

(Embodiments)

While the present invention will be described with reference to several embodiments more particularly below, the present invention is not intended to be limited to them. In the embodiments, any photoelectric conversion element produced has an area of the electrode of 1.0×1.0 cm, and the light of 100 mW/cm$^2$ (AM 1.5) provided by a solar simulator (JIS, C8912, B rank) was used as a light source for operating the photoelectric conversion element. And, each of the values used in the embodiments was determined as follows.

The Layer Thickness of the Transparent Conductive Film

The layer thickness of the transparent conductive film was determined with an interference thickness measuring device.

The Resistance of the Transparent Conductive Film

The resistance of the transparent conductive film was determined with a resistivity measuring device based on a four probe method.

The Effective Photon Flux Density Loss Coefficient of the Transparent Conductive Film The effective photon flux density loss coefficient of the transparent conductive film was determined based on the spectral irradiance distribution (JIS, C8911) of a reference sunlight of AM 1.5 and the spectral characteristics of the photoelectric conversion layer and transparent conductive film obtained using the ultraviolet and visible rays absorption spectrum measuring device.

EXAMPLE FOR REFERENCE 6.41 g of titanium tetraisopropoxide is diluted with 20 ml of ethanol, and 0.514 g of nitric acid having a specific gravity of 1.38 and 0.2 ml of water are added thereto with the mixture being subject to agitation. This mixing operationwascarriedoutinadrynitrogenatmosphere. Then, this mixture had its temperature elevated up to 80° C. and underwent reduction for two hours in a dry nitrogen air flow to provide a colorless and transparent so: liquid. After this sol liquid was cooled down to the room temperature, 0.1 g of polyacrylic acid was dissolved in 2 g of the sol liquid with the sol liquid being subject to agitation. 2 ml of water was added to the resultant sol liquid to provide a colorless, transparent, and homogeneous sol liquid. This sol liquid, enclosed in a glass vessel, had its temperature elevated up to 80° C. The sol liquid completed gelation approximately in 5 minutes, and a substantially transparent homogeneous gel was provided. By being held at 80° C. for further 15 hours, this gel dissolved again to provide a whitish translucent sol liquid.

Figure 4:
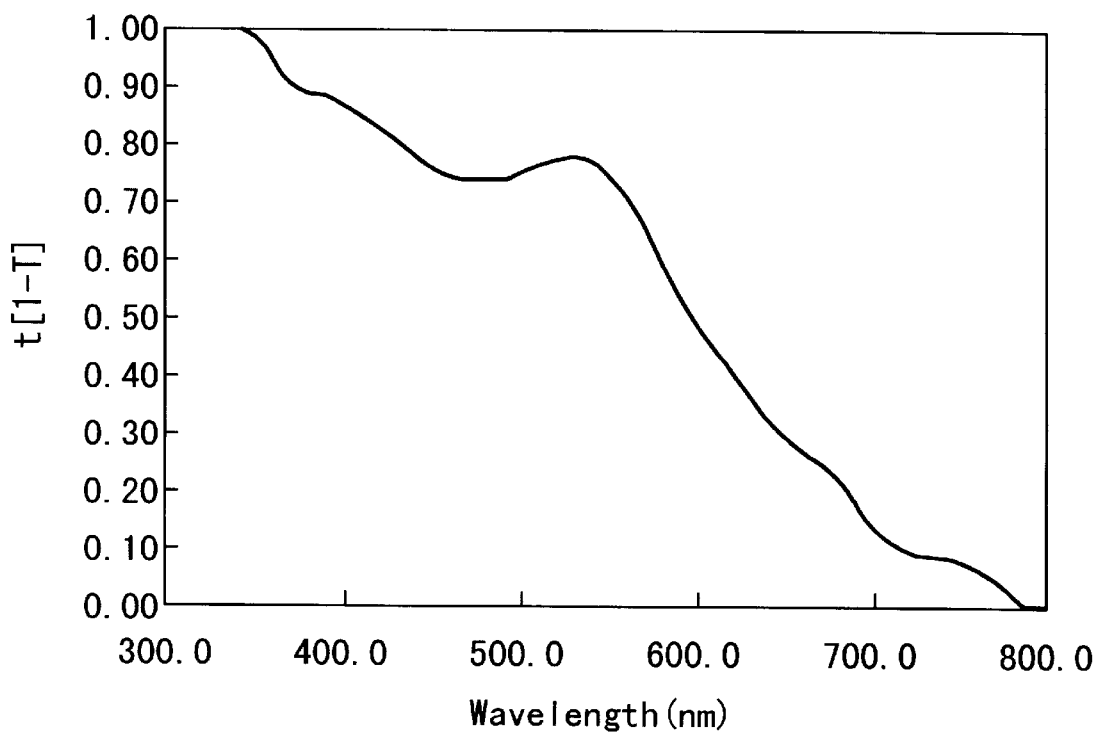
FIG. 4 is a graph showing the absorptivity of the glass substrate having the porous semiconductor layer formed on it (porous $TiO_2$ film+Ru complex) according to an example for reference.

Next, the resultant sol liquid was applied to the glass plate by spin coating, and underwent firing by having its temperature elevated up to 450° C., and being held at the temperature for 20 minutes. These process steps of application and firing were repeated 20 times to provide a porous semiconductor layer having a layer thickness of 3.5 $\mu$m. Then, the glass plate having the porous semiconductor layer formed on its surface was immersed in an ethanol solution containing Ru complex (having a concentration of 10$^{-3}$ mol/l) to carry out an absorption process of the Ru complex. The Ru complex has a structural formula (A) described below. The absorptivity of the sample that has the porous semiconductor layer formed on the glass substrate is shown in FIG. 4.

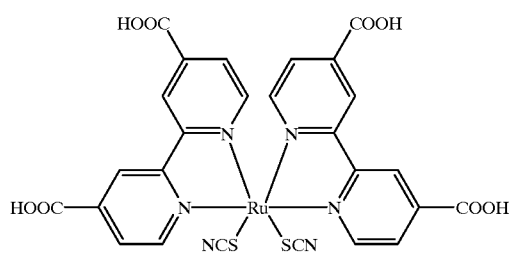

(A)

(Embodiment 1)

Figure 5:
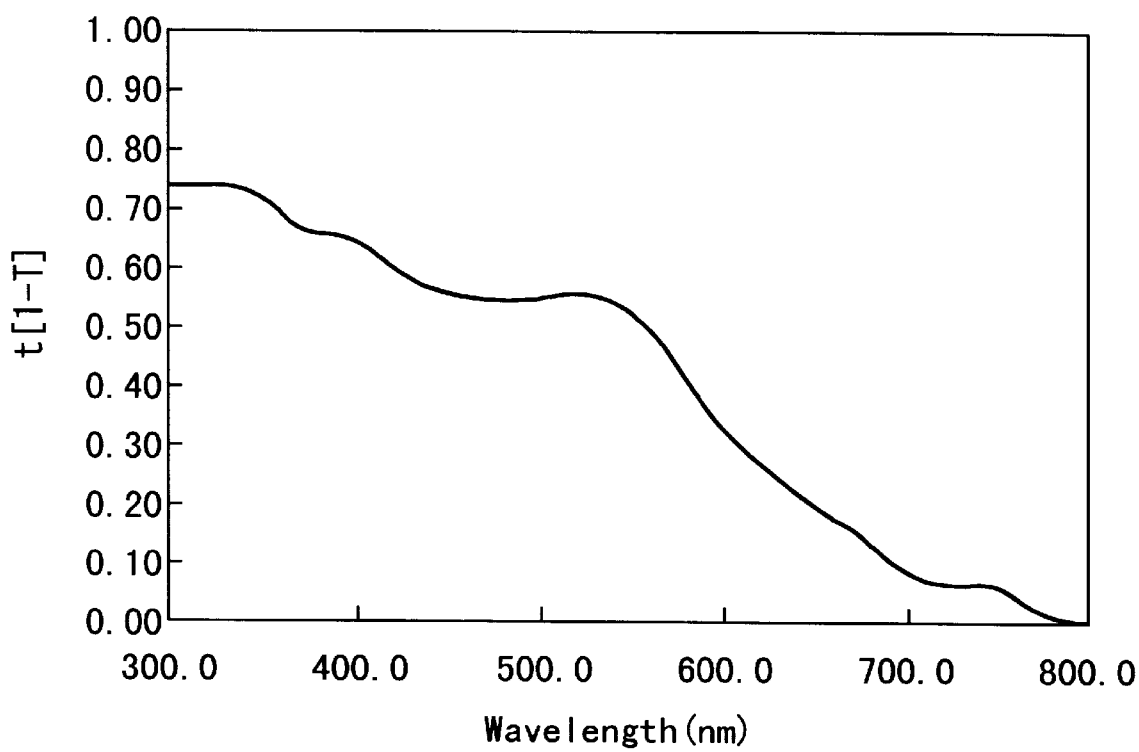
FIG. 5 is a graph showing the absorptivity of the transparent electrode on the side of the light-receiving face having the porous semiconductor layer formed on it (FTO film/porous $TiO_2$ film+Ru complex) according to the embodiment 1.

The porous semiconductor layer was formed in the same manner as in the example for reference except that, rather than the glass plate in the example for reference, a transparent electrode on the side of the light-receiving face having a fluorine-doped tin oxide film (FTO film having a layer thickness of $1.1 \times 10^{-6}$ m) formed as a transparent conductive film on the glass plate is used, and the absorption process of the Ru complex was carried out. The absorptivity of the sample that is constructed of the porous semiconductor layer and transparent electrode on the side of the light-receiving face having the FTO film (having a layer thickness of $1.1 \times 10^{-6}$ m) formed on the glass plate is shown in FIG. 5. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced by bonding together the porous semiconductor layer and the counter electrode having a Pt film formed on a glass plate, sealing their end faces with some portions remaining open, and impregnating the portion between the electrodes with an electrolyte via the capillarity. For the electrolyte, a mixture of ethylene carbonate and acetonitrile (the mixing ratio by volume=4/1) containing tetrapropylammoniumiodide (0.46 M) and iodine (0.06 M) was used.

The current-voltage characteristics of the produced photoelectric conversion element were measured by radiating the transparent electrode on the side of the light-receiving face of the element with the light of AM 1.5 and 100 mW/cm$^2$. Then, the photoelectric conversion effic:iency was determined based on the short-circuit current density, open-circuit voltage, and fill factor obtained from the current-voltage characteristics. The results are shown in Table 1.

(Embodiment 2)

Figure 6:
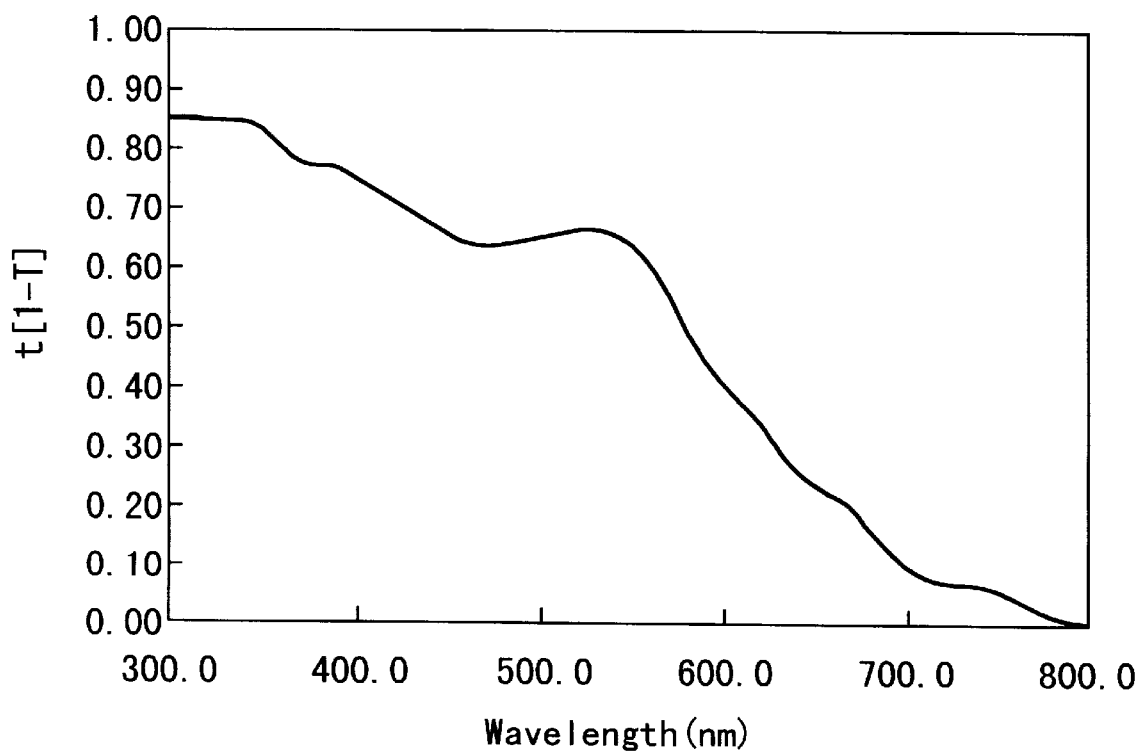
FIG. 6 is a graph showing the absorptivity of the transparent electrode on the side of the light-receiving face having the porous semiconductor layer formed on it (FTO film/porous $TiO_2$ film+Ru complex) according to the embodiment 2.

The porous semiconductor layer was formed in the same manner as in the embodiment 1 except that a fluorine-doped tin oxide film (FTO film having a layer thickness of $6.2 \times 10^{-7}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the FTO film (having a layer thickness of $6.2 \times 10^{-7}$ m) formed on the glass plate is shown in FIG. 6. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

(Embodiment 3)

Figure 7:
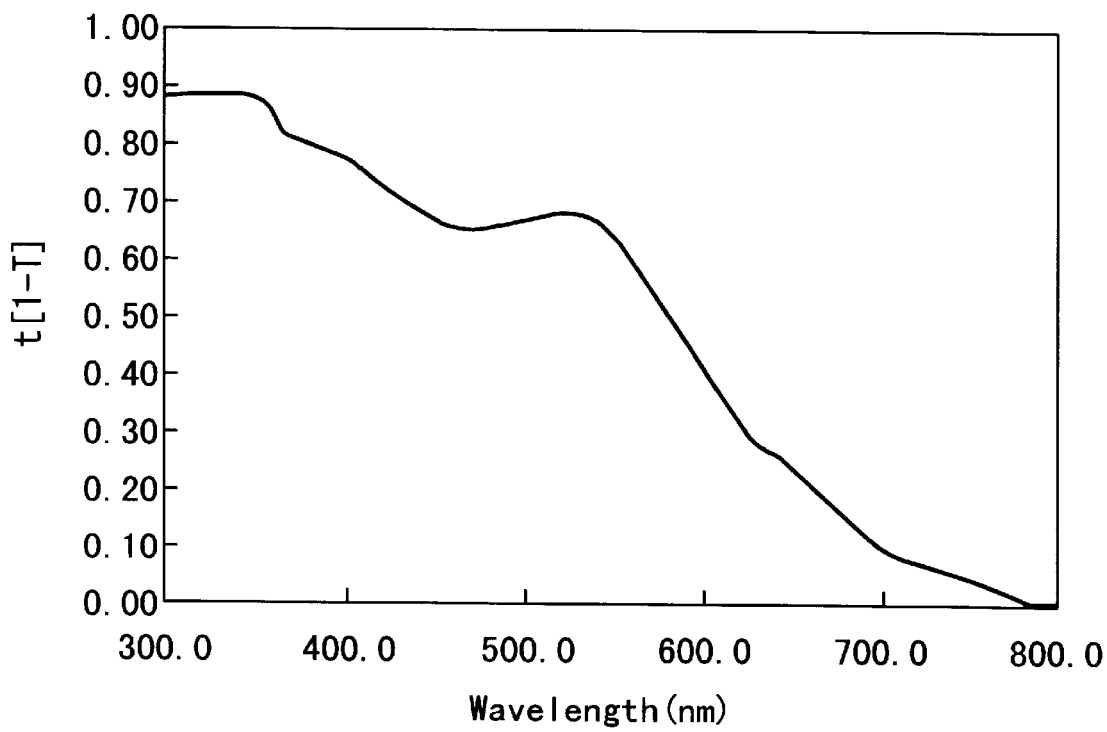
FIG. 7 is a graph showing the absorptivity of the transparent electrode on the side of the light-receiving face having the porous semiconductor layer formed on it (FTO film/porous $TiO_2$ film+Ru complex) according to the embodiment 3.

The porous semiconductor layer was formed in the same manner as in the embodiment 1 except that a fluorine-doped tin oxide film (FTO film having a layer thickness of $2.9 \times 10^{-7}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the FTO film (having a layer thickness of $2.9 \times 10^{-7}$ m) formed on the glass plate is shown in FIG. 7. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

COMPARATIVE EXAMPLE 1

Figure 8:
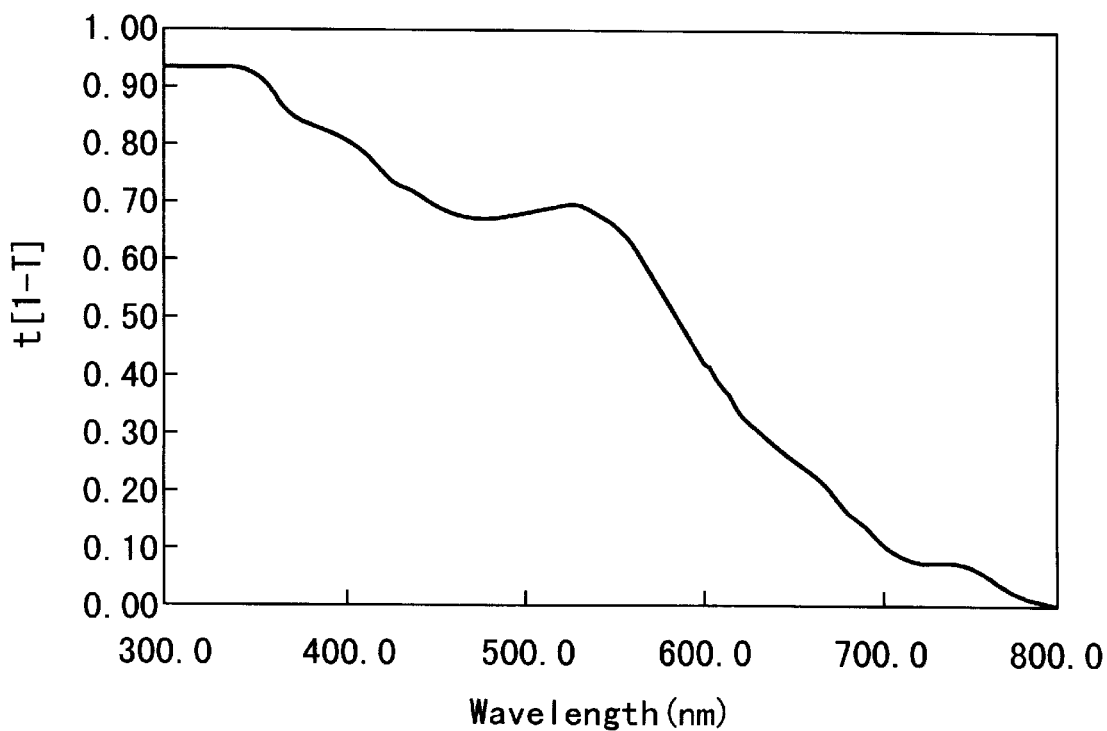
FIG. 8 is a graph showing the absorptivity of the transparent electrode on the side of the light-receiving face having the porous semiconductor layer formed on it (FTO film/porous $TiO_2$ film+Ru complex) according to the Comparative Example 1.

The porous semiconductor layer was formed in the same manner as in the embodiment 1 except that a fluorine-doped tin oxide film (FTO film having a layer thickness of $3.0 \times 10^{-8}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the FTO film (having a layer thickness of $3.0 \times 10^{-8}$ m) formed on the glass plate is shown in FIG. 8. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

COMPARATIVE EXAMPLE 2

The porous semiconductor layer was formed in the same manner as in the embodiment 1 except that a fluorine-doped tin oxide film (FTO film having a layer thickness of $2.3 \times 10^{-5}$ m) formed on a glass substrate was used as a transparent electrode on the side of the light-receiving face, and the absorption process of the Ru complex was carried out. And, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

(Embodiment 4)

Figure 9:
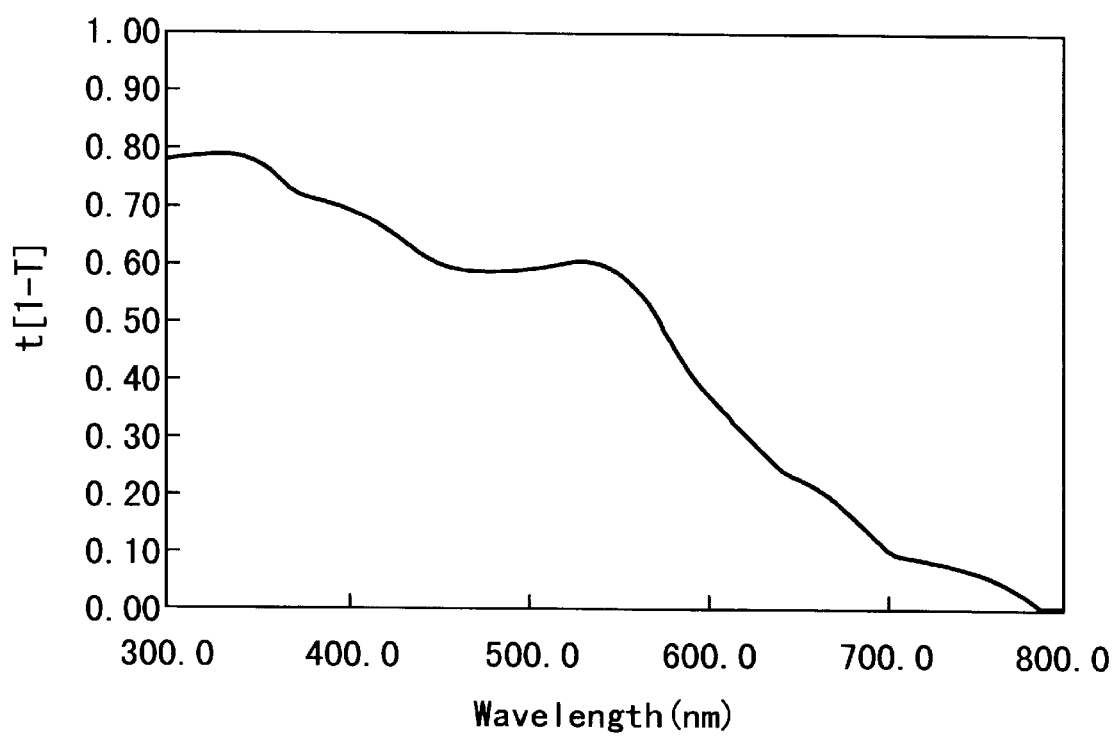
FIG. 9 is a graph showing the absorptivity of the transparent electrode on the side of the light-receiving face having the porous semiconductor layer formed on it (ITO film/porous $Tio_2$ film+Ru complex) according to the embodiment 4.

The porous semiconductor layer was formed in the same manner as in the embodiment 1 except that an Sn-doped In$_2$O$_3$ film (ITO film having a layer thickness of $2.3 \times 10^{-7}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the ITO film (having a layer thickness of $2.3 \times 10^{-7}$ m) formed on the glass plate is shown in FIG. 9. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

(Embodiment 5)

Figure 10:
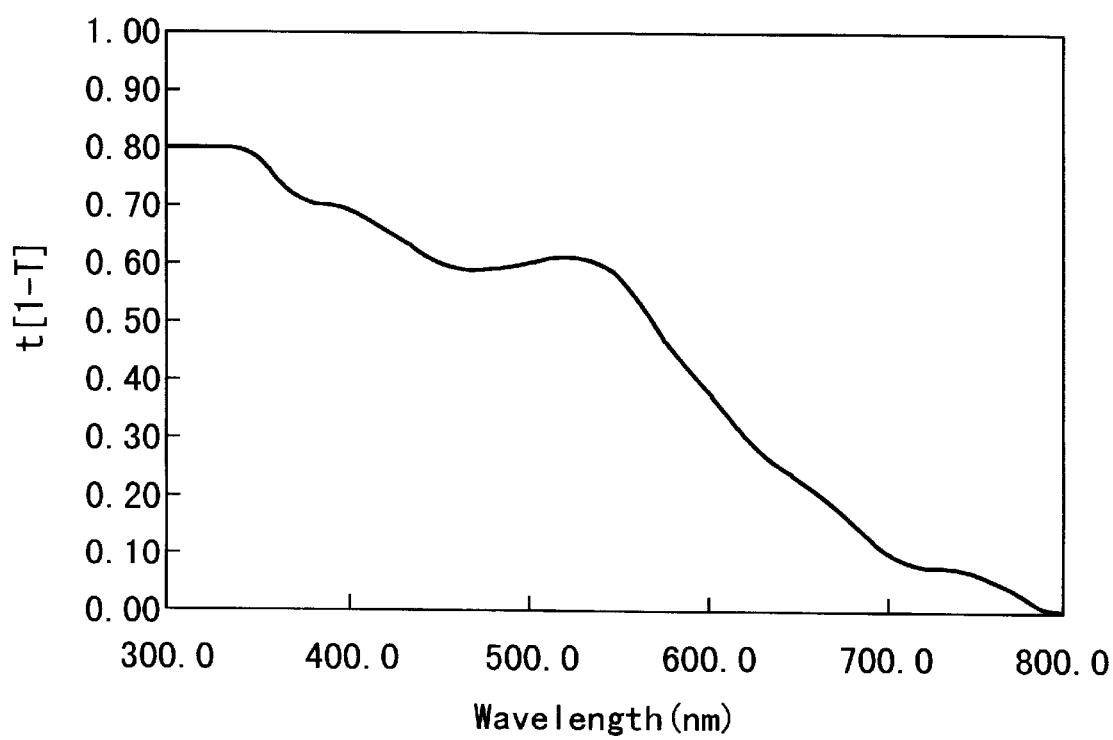
FIG. 10 is a graph showing the absorptivity of the transparent electrode on the side of the light-receiving face having the porous semiconductor layer formed on it (ITO film/porous $TiO_2$ film+Ru complex) according to the embodiment 5.

The porous semiconductor layer was formed in the same manner as in the embodiment 1 except that an Sn-doped $In_2O_3$ film (ITO film having a layer thickness of $8.8 \times 10^{-8}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the ITO film (having a layer thickness of $8.8 \times 10^{-8}$ m) formed on the glass plate is shown in FIG. 10. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

(Embodiment 6)

Figure 11:
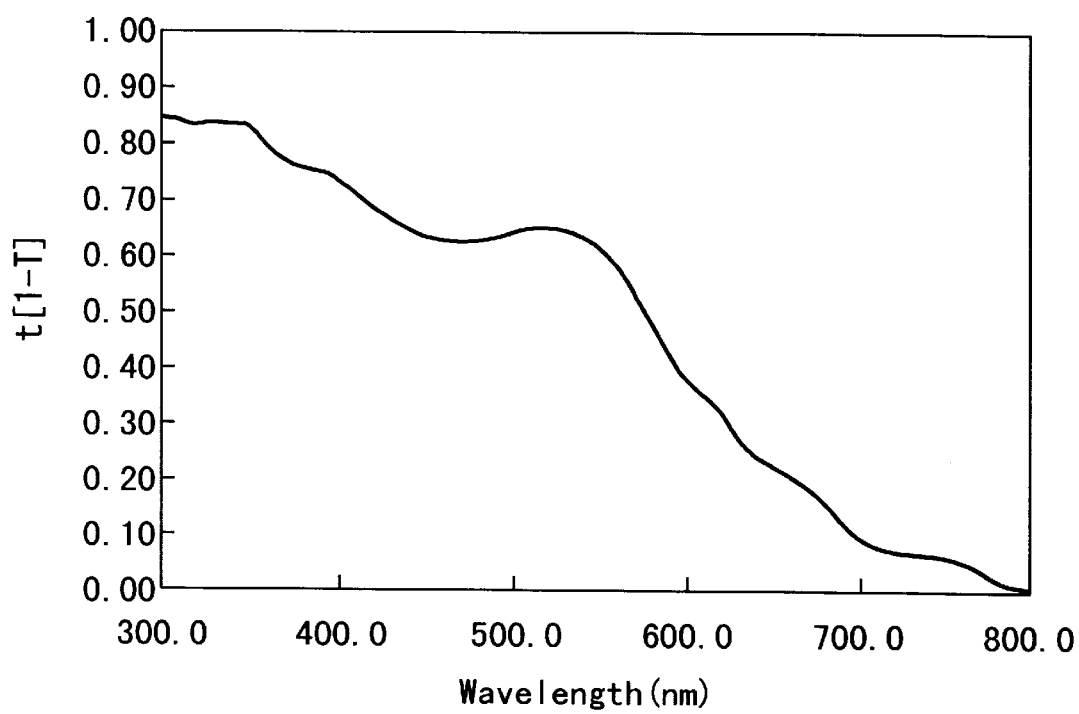
FIG. 11 is a graph showing the absorptivity of the transparent electrode on the side of the light-receiving face having the porous semiconductor layer formed on it (ITO film/porous $TiO_2$ film+Ru complex) according to the embodiment 6.

The porous semiconductor layer was formed in the same manner as in the embodiment 1 except that an Sn-doped $In_2O_3$ film (ITO film having a layer thickness of $4.5 \times 10^{-8}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the ITO film (having a layer thickness of $4.5 \times 10^{-8}$ m) formed on the glass plate is shown in FIG. 11. In addition, the resistivity, layer thickness, and effective photon flux density loss coefficient cf the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

COMPARATIVE EXAMPLE 3

Figure 12:
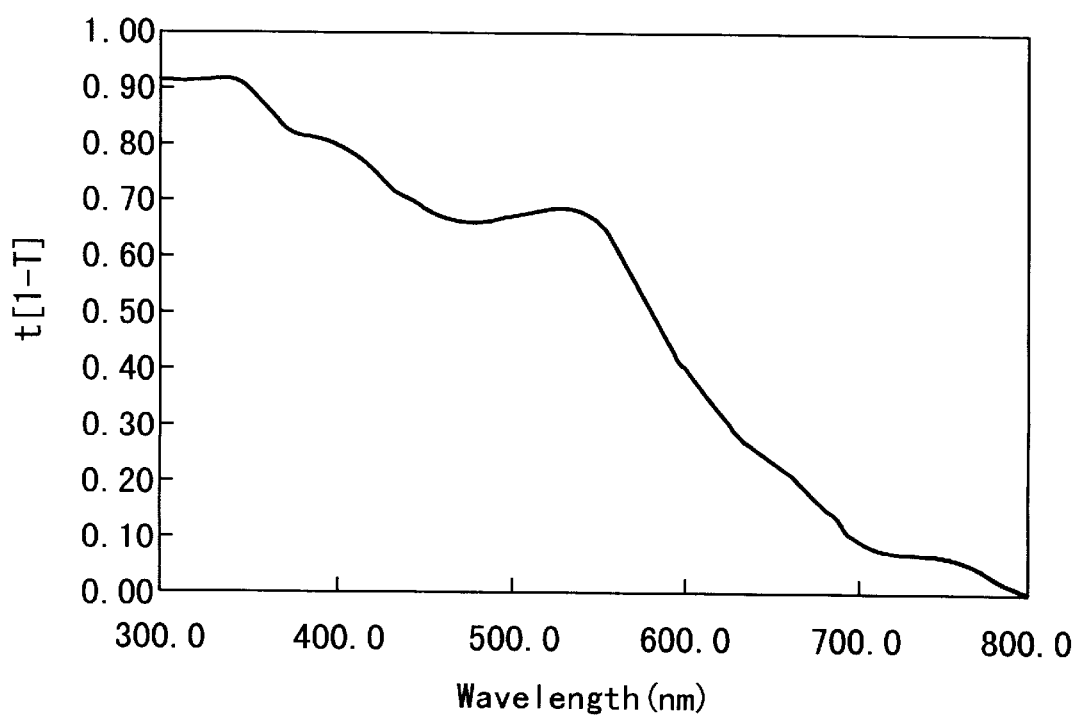
FIG. 12 is a graph showing the absorptivity of the transparent electrode on the side of the light-receiving face having the porous semiconductor layer formed on it (ITO film/porous $TiO_2$ film+Ru complex) according to the Comparative Example 2.

The porous semiconductor layer was formed in the same manner as in the embodiment 1 except that an Sn-doped $In_2O_3$ film (ITO film having a layer thickness of $2.5 \times 10^{-8}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the ITO film (having a layer thickness of $2.5 \times 10^{-8}$ m) formed on the glass plate is shown in FIG. 12. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

COMPARATIVE EXAMPLE 4

The porous semiconductor layer was formed in the same manner as in the embodiment 1 except that an Sn-doped $In_2O_3$ film (ITO film having a layer thickness of $1.9 \times 10^{-5}$ m) formed on a glass substrate was used as a transparent electrode on the side of the light-receiving face, and the absorption process of the Ru complex was carried out. And, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

(Embodiment 7)

Figure 13:
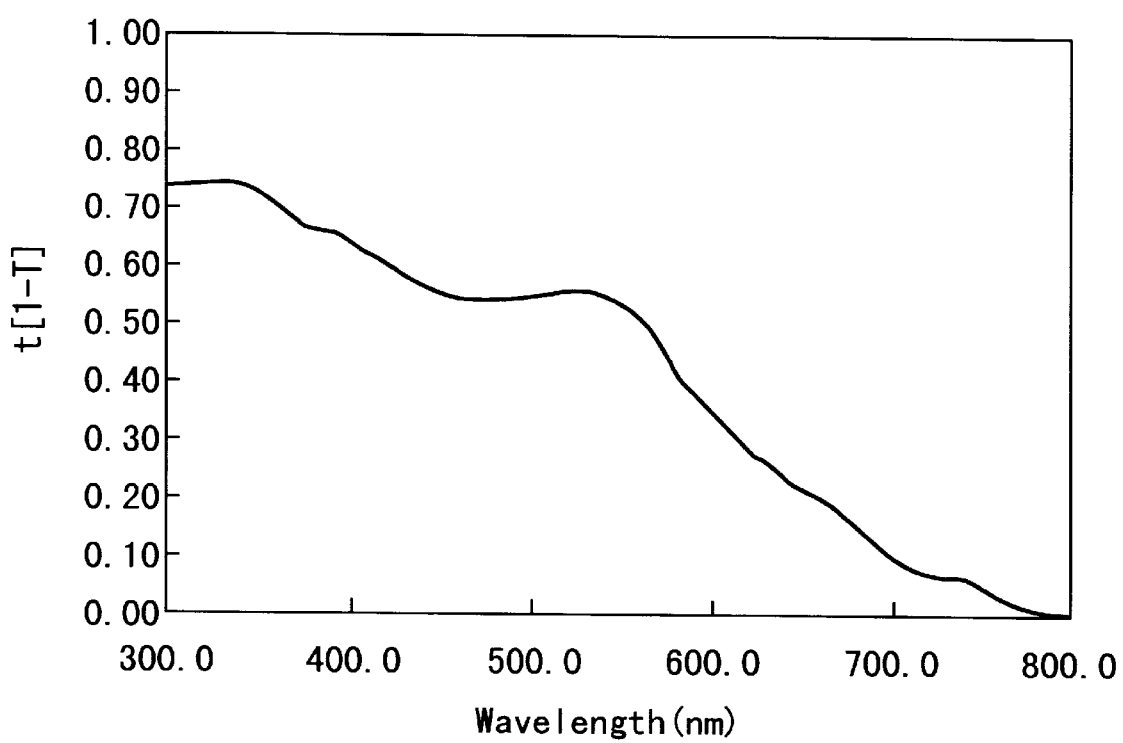
FIG. 13 is a graph showing the absorptivity of the transparent electrode on the side of the light-receiving face having the porous semiconductor layer formed on it (AZO film/porous $TiO_2$ film+Ru complex) according to the embodiment 7.

The porous semiconductor layer was formed in the same manner as in the embodiment 1 except that an Al-doped zinc oxide film (AZO film having a layer thickness of $1.2 \times 10^{-6}$ m) formed on a glass substrate was used as a transparent electrode on the side of the light-receiving face, and the absorption process of the Ru complex was carried out. The absorptivity of the sample that is constructed of the porous semiconductor layer and transparent electrode on the side of the light-receiving face having the AZO film (having a layer thickness of $1.2 \times 10^{-6}$ m) formed on the glass plate is shown in FIG. 13. In addition, the resistivity, layer thickness, and effective photon flux density loss coefficient of the transparent conductive film are shown in Table 1.

Using the transparent electrode on the side of the light-receiving face having the porous semiconductor layer formed on it, a photoelectric conversion element was produced and the conversion efficiency was determined in the same manner as in the embodiment 1. The results are shown in Table 1.

TABLE 1

| | Transparent conductive film | | | Conversion efficiency | Conditional equation | | |
|---|---|---|---|---|---|---|---|
| | Principal component | $\rho(\Omega \cdot m)$ | f(1/m) | L(m) | $\eta$ | Equation (1) | Equation (2) | Equation (3) |
| Embodiment 1 | $SnO_2$ | 1.3E–05 | 2.6E+05 | 1.1E–06 | 6.7E–02 | TRUE | TRUE | TRUE |
| Embodiment 2 | $SnO_2$ | 2.3E–05 | 2.4E+05 | 6.2E–07 | 4.1E–02 | TRUE | TRUE | FALSE |
| Embodiment 3 | $SnO_2$ | 2.4E–05 | 4.4E+05 | 2.9E–07 | 1.7E–02 | TRUE | FALSE | FALSE |

TABLE 1-continued

| | Transparent conductive film | | | | Conversion efficiency | Conditional equation | | |
|---|---|---|---|---|---|---|---|---|
| | Principal component | $\rho(\Omega \cdot m)$ | f(1/m) | L(m) | $\eta$ | Equation (1) | Equation (2) | Equation (3) |
| Comparative Example 1 | $SnO_2$ | 4.2E−05 | 2.1E+05 | 3.0E−08 | 8.7E−03 | FALSE | FALSE | FALSE |
| Comparative Example 2 | $SnO_2$ | 2.2E−05 | 2.1E+05 | 2.3E−05 | 2.4E−03 | FALSE | FALSE | FALSE |
| Embodiment 4 | $In_2O_3$ | 3.2E−06 | 1.1E+05 | 2.3E−07 | 6.1E−02 | TRUE | TRUE | TRUE |
| Embodiment 5 | $In_2O_3$ | 2.9E−06 | 2.5E+05 | 8.8E−08 | 3.5E−02 | TRUE | TRUE | FALSE |
| Embodiment 6 | $In_2O_3$ | 3.6E−06 | 3.6E+05 | 4.5E−08 | 1.8E−02 | TRUE | FALSE | FALSE |
| Comparative Example 3 | $In_2O_3$ | 5.0E−06 | 3.3E+05 | 2.5E−08 | 6.6E−03 | FALSE | FALSE | FALSE |
| Comparative Example 4 | $In_2O_3$ | 3.4E−06 | 2.6E+05 | 1.9E−05 | 3.1E−03 | FALSE | FALSE | FALSE |
| Embodiment 7 | ZnO | 4.8E−05 | 2.4E+05 | 1.2E−06 | 2.9E−02 | TRUE | TRUE | FALSE |

From Table 1, it is apparent that, for the required conversion efficiency, the photoelectric conversion element according to the present invention has. the minimum layer thickness of the transparent electrode on the side of the light-receiving face, and is produced at the lowest cost.

Therefore, according to the present invention, an inexpensive photoelectric conversion element responsive to the desired conversion efficiency may be provided.

What is claimed is:

1. A photoelectric conversion element comprisinig:
a transparent electrode having a light receiving face;
a photoelectric conversion layer; and
a counter electrode,
wherein a thickness L (m) of the transparent electrode satisfies an equation (1), $$1.2 \times 10^{-2} \times \rho \leq L \leq 4.6/f \quad (1)$$

where $\rho$ represents a resistivity ($\Omega$m) of the transparent electrode, and f represents an effective photon flux density loss coefficient (1/m) of the transparent electrode.

2. The photoelectric conversion element according to claim 1, wherein the photoelectric conversion layer has a porous semiconductor layer carrying a coloring material.

* * * * *